(12) United States Patent
Ando et al.

(10) Patent No.: US 8,716,088 B2
(45) Date of Patent: *May 6, 2014

(54) SCAVENGING METAL STACK FOR A HIGH-K GATE DIELECTRIC

(75) Inventors: Takashi Ando, Tuckahoe, NY (US); Unoh Kwon, Fishkill, NY (US); Vijay Narayanan, New York, NY (US); James K. Schaeffer, Dresden (DE)

(73) Assignees: International Business Machines Corporation, Armonk, NY (US); GLOBAL FOUNDRIES Inc. (KY)

( * ) Notice: Subject to any disclaimer, the term of this patent is extended or adjusted under 35 U.S.C. 154(b) by 10 days.

This patent is subject to a terminal disclaimer.

(21) Appl. No.: 13/534,573

(22) Filed: Jun. 27, 2012

(65) Prior Publication Data

US 2014/0004695 A1    Jan. 2, 2014

(51) Int. Cl.
*H01L 21/8234* (2006.01)
*H01L 21/8238* (2006.01)
*H01L 29/49* (2006.01)
*H01L 29/51* (2006.01)

(52) U.S. Cl.
CPC .... *H01L 21/823828* (2013.01); *H01L 29/4958* (2013.01); *H01L 29/517* (2013.01); *H01L 21/823857* (2013.01)
USPC .... 438/287; 257/407; 257/410; 257/E21.625; 257/E21.635; 257/E29.296

(58) Field of Classification Search
CPC ....... H01L 29/49; H01L 29/78; H01L 29/517; H01L 29/4908; H01L 29/4958; H01L 21/823828; H01L 21/823857
USPC ......... 257/407, 410, 411, E29.296, E29.298, 257/E21.625, E21.635; 438/285, 287
See application file for complete search history.

(56) References Cited

U.S. PATENT DOCUMENTS

| | | | |
|---|---|---|---|
| 6,268,258 B1 | 7/2001 | Joo et al. | |
| 6,444,592 B1 | 9/2002 | Ballantine et al. | |
| 6,528,374 B2 | 3/2003 | Bojarczuk, Jr. et al. | |
| 6,890,807 B2 | 5/2005 | Chau et al. | |
| 7,226,831 B1 | 6/2007 | Metz et al. | |
| 7,750,418 B2 | 7/2010 | Chudzik et al. | |
| 7,989,902 B2 | 8/2011 | Ando et al. | |
| 8,367,496 B2 * | 2/2013 | Ando et al. | 438/216 |

(Continued)

OTHER PUBLICATIONS

T. Ando et al., "Ultimate EOT Scaling (<5A) Using Hf-Based High-k Gate Dielectrics and Impact on Carrier Mobility," ECS Trans., vol. 28, No. 1, 2010, pp. 115-123.

(Continued)

*Primary Examiner* — Allan R Wilson
(74) *Attorney, Agent, or Firm* — Cantor Colburn LLP; Vazken Alexanian

(57) ABSTRACT

A semiconductor structure is provided. The structure includes a semiconductor substrate of a semiconductor material and a gate dielectric having a high dielectric constant dielectric layer with a dielectric constant greater than silicon. The gate dielectric is located on the semiconductor substrate. A gate electrode abuts the gate dielectric. The gate electrodes includes a lower metal layer abutting the gate dielectric, a scavenging metal layer abutting the lower metal layer, an upper metal layer abutting the scavenging metal layer, and a silicon layer abutting the upper metal layer. The scavenging metal layer reduces an oxidized layer at an interface between the upper metal layer and the silicon layer responsive to annealing.

7 Claims, 7 Drawing Sheets

(56) References Cited

U.S. PATENT DOCUMENTS

| | | | |
|---|---|---|---|
| 2007/0059910 A1* | 3/2007 | Pei et al. | 438/591 |
| 2009/0152651 A1* | 6/2009 | Bu et al. | 257/411 |
| 2009/0269939 A1 | 10/2009 | Sprey | |
| 2009/0316331 A1 | 12/2009 | Nakabayashi | |
| 2010/0133501 A1 | 6/2010 | Sakamoto et al. | |
| 2010/0213555 A1* | 8/2010 | Hargrove et al. | 257/411 |
| 2010/0244206 A1 | 9/2010 | Bu et al. | |
| 2010/0320547 A1 | 12/2010 | Ando et al. | |
| 2011/0012210 A1 | 1/2011 | Xu | |
| 2011/0073964 A1* | 3/2011 | Chowdhury et al. | 257/411 |
| 2011/0207280 A1 | 8/2011 | Ando et al. | |
| 2011/0298053 A1 | 12/2011 | Zhong et al. | |
| 2013/0001743 A1 | 1/2013 | Frank | |
| 2013/0075833 A1* | 3/2013 | Liu et al. | 257/411 |

OTHER PUBLICATIONS

T. Ando et al., "Understanding Mobility Mechanisms in Extremely Scaled HfO2 (EOT 0.42 nm) Using Remote Interfacial Layer Scavenging Technique and Vt-tuning Dipoles with Gate-first Process," 2009 IEEE International Electron Devices Meeting (IEDM), Dec. 7-9, 2009, pp. 423-426.

Lee, et al.. "HfOx Bipolar Resistive Memory Robust Endurance Using AlCu as Buffer Electrode", IEEE Electron Device Letters, vol. 30, No. 7, 2009; pp. 703-705, Jul. 2009.

Ogawa, et al., "0.6nm-EOT High-k Gate Stacks with HfSiOx Interfacial Layer Grown by Solid-Phase Reaction Between HfO2 and Si Substrate", Microelectronic Engineering, vol. 84, Issues 9-10, Sep.-Oct. 2007; pp. 1861-1864.

M.M. Frank, "High-k/metal Gate Innovations Enabling Continued CMOS Scaling," Proceedings of the ESSCIRC, Sep. 12-16, 2011, pp. 50-58.

B. Govoreanu et al., "Performance and Reliability of HfAlOx-based Interpoly Dielectrics for Floating-gate Flash Memory," Solid-State Electronics, vol. 52, Issue 4, Apr. 2008, pp. 557-563, Available online Feb. 21, 2008.

B. Govoreanu, et al., "The Flash Memory for the Nodes to Come: Material Issues from a Device Perspective," ECS Transactions, 19 (2) 649-668 (2009), 10.1149/1.3122122 The Electrochemical Society.

Jan Van Houdt, "Charge-based Nonvolatile Memory: Near the End of the Roadmap?" Current Applied Physics 11 (2011) e21-e24, Current Applied Physics, journal homepage: www.elsevier.com/locate/cap, Memory Devices Design Group, Imec, Kapeldreef 75, B-3001 Leuven, Belgium, Online Feb. 17, 2011.

H.S. Jung et al., "A Highly Manufacturable MIPS (Metal Inserted Poly-Si Stack) Technology with Novel Threshold with Novel Threshold Voltage Control," Digest of Technical Papers, 2005 Symposium on VLSI Technology, Jun. 14-16, 2005, pp. 232-233.

C. Ludwig, "Advances in Flash Memory Devices," Materials Science-Poland, vol. 28, No. 1, 2010, pp. 1-11.

W. Weinreich, et al., "Impact of Interface Variations on J-V and C-V Polarity Asymmetry of MIM Capacitors with Amorphous and Crystalline Zr(1-x)AlxO2 Films," Microelectronic Engineering 86 (2009) 1826-1829, journal homepage: www.elsevier.com/locate/mee, Microelectronic Engineering, Mar. 16, 2009.

Wenger et al., "The Role of the HfO2-TiN Interface in Capacitance-Voltage Nonlinearity of Metal-Insulator-Metal Capacitors," Thin Solid Films 517 (2009) 6334-6336, journal homepage: www.elsevier.com/locate/tsf.

M.C. Wu et al., "Highly Stable SrZrO3 Bipoloar Resistive Switching Memory by Ti Modulation Layer," ECS Trans., vol. 28, No. 2, 2010, pp. 411-420.

* cited by examiner

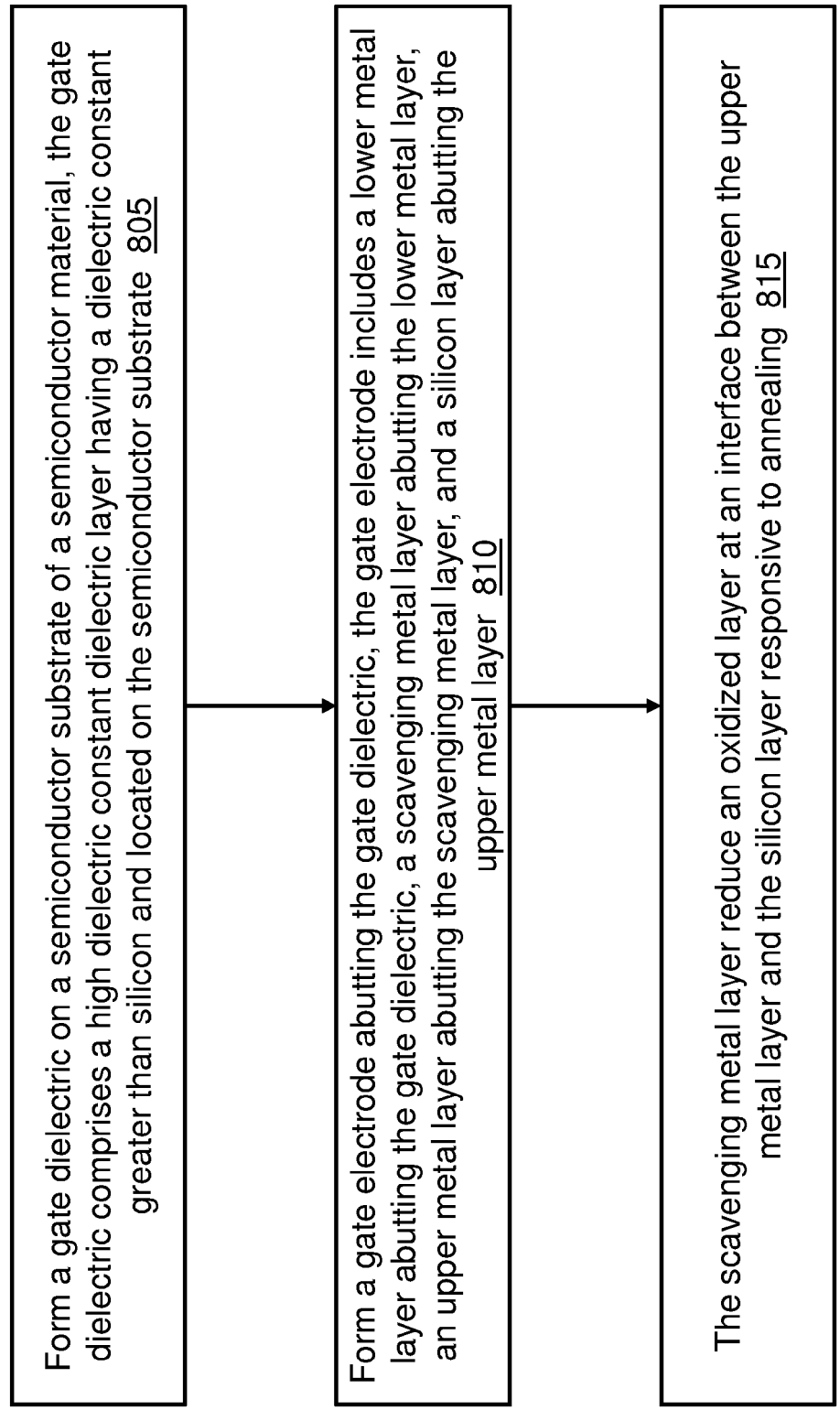

FIG. 8

Form a gate dielectric on a semiconductor substrate of a semiconductor material, the gate dielectric comprises a high dielectric constant dielectric layer having a dielectric constant greater than silicon and located on the semiconductor substrate  805

Form a gate electrode abutting the gate dielectric, the gate electrode includes a lower metal layer abutting the gate dielectric, a scavenging metal layer abutting the lower metal layer, an upper metal layer abutting the scavenging metal layer, and a silicon layer abutting the upper metal layer  810

The scavenging metal layer reduce an oxidized layer at an interface between the upper metal layer and the silicon layer responsive to annealing  815

SCAVENGING METAL STACK FOR A HIGH-K GATE DIELECTRIC

BACKGROUND

The present invention generally relates to semiconductor devices, and particularly to a metal gate stack included in an electrode over a high-k gate dielectric, and methods of manufacturing the same.

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below the thickness of 1.1 nm for the silicon oxide gate dielectric.

High-k gate dielectric provides a way of scaling down the thickness of the gate dielectric without an excessive increase in the gate leakage current. However, high-k gate dielectric materials are prone to a change in the effective oxide thickness (EOT) because high-k gate dielectric materials react with oxygen that diffuses through the gate electrode or gate spacers. Regrowth of a silicon oxide interfacial layer between a silicon substrate and the high-k gate dielectric during high-temperature processing steps is a major obstacle to successful effective oxide thickness scaling. Particularly, typical stacks of a high-k gate dielectric and a metal gate is known to be susceptible to a high temperature anneal in an oxygen ambient. Such a high temperature anneal in oxygen ambient results in regrowth of the silicon oxide interfacial layer and produces instability of the threshold voltage of field effect transistors.

SUMMARY

According to an embodiment, a method of forming a semiconductor structure is provided. The method includes forming a gate dielectric on a semiconductor substrate of a semiconductor material. The gate dielectric includes a high dielectric constant dielectric layer having a dielectric constant greater than silicon and is located on the semiconductor substrate. The method includes forming a gate electrode abutting the gate dielectric. The gate electrode includes a lower metal layer abutting the gate dielectric, a scavenging metal layer abutting the lower metal layer, an upper metal layer abutting the scavenging metal layer, and a silicon layer abutting the upper metal layer. The scavenging metal layer reduces an oxidized layer at an interface between the upper metal layer and the silicon layer responsive to annealing.

According to an embodiment, a semiconductor structure is provided. The structure includes a semiconductor substrate of a semiconductor material, a gate dielectric having a high dielectric constant dielectric layer having a dielectric constant greater than silicon and located on the semiconductor substrate, and a gate electrode abutting the gate dielectric. The gate electrodes includes a lower metal layer abutting the gate dielectric, a scavenging metal layer abutting the lower metal layer, an upper metal layer abutting the scavenging metal layer, and a silicon layer abutting the upper metal layer. The scavenging metal layer reduces an oxidized layer at an interface between the upper metal layer and the silicon layer responsive to annealing.

BRIEF DESCRIPTION OF THE SEVERAL VIEWS OF THE DRAWINGS

FIG. 8 is a method of forming the exemplary semiconductor structure with the scavenging metal layer to remove/reduce oxygen in one or more oxidized layers according to an embodiment.

DETAILED DESCRIPTION

Figure 1:
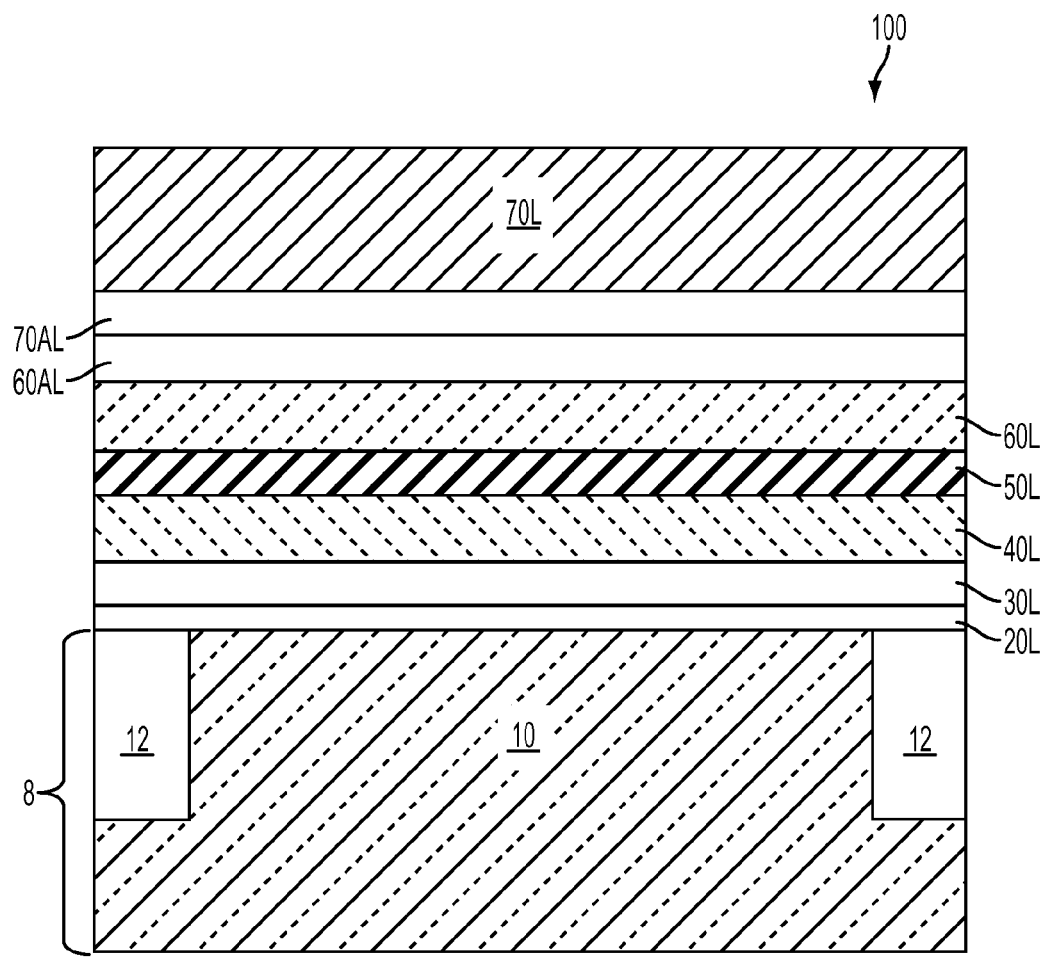
FIG. 1 is a vertical cross-sectional view of an exemplary semiconductor structure after formation of a high-k dielectric layer, a lower metal layer, a scavenging metal layer, an upper metal layer, and a polycrystalline semiconductor layer according to according to an embodiment.

As stated above, embodiments relate to a metal gate stack included in an electrode over a high-k gate dielectric, and methods of manufacturing the same, which are now described in detail with accompanying figures. It is noted that like and corresponding elements are referred to by like reference numerals. The drawings are not drawn to scale.

Referring to FIG. 1, an exemplary semiconductor structure according to an embodiment comprises a semiconductor substrate 8 and a stack of material layers formed thereupon. The semiconductor substrate 8 contains a substrate semiconductor layer 10 and shallow trench isolation structures 12. The substrate semiconductor layer 10 has a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material of the substrate semiconductor layer 10 comprises silicon, and more typically, the semiconductor material of the substrate semiconductor layer 10 is silicon.

In case the semiconductor material of the substrate semiconductor layer 10 is a single crystalline silicon-containing semiconductor material, the single crystalline silicon-containing semiconductor material is particularly selected from single crystalline silicon, a single crystalline silicon carbon alloy, a single crystalline silicon germanium alloy, and a single crystalline silicon germanium carbon alloy.

The semiconductor material of the substrate semiconductor layer 10 may be appropriately doped either with p-type dopant atoms or with n-type dopant atoms. The dopant concentration of the substrate semiconductor layer 10, and may be from $1.0\times10^{15}/cm^3$ to $1.0\times10^{19}/cm^3$, and typically from $1.0\times10^{16}/cm^3$ to $3.0\times10^{18}/cm^3$, although lesser and greater dopant concentrations are contemplated herein also. Particularly, the substrate semiconductor layer 10 is single crystalline. The semiconductor substrate 8 may be a bulk substrate, a semiconductor-on-insulator (SOI) substrate, or a hybrid substrate. The semiconductor substrate 8 may, or may not, have a built-in stress in the substrate semiconductor layer 10. While the present disclosure is described with a bulk substrate, implementation of the present disclosure on an SOI substrate or on a hybrid substrate is explicitly contemplated herein. The shallow trench isolation structure 12 comprises a dielectric material such as silicon oxide or silicon nitride, and is formed by methods well known in the art.

An unpatterned chemical oxide layer 20L (which may be referred to as a first oxide layer) may be formed on the exposed semiconductor surface of the substrate semiconductor layer 10. An unpatterned high dielectric constant (high-k) dielectric layer 30L is formed directly on the top surface of the unpatterned chemical oxide layer 20L. Even in the case where the unpatterned chemical oxide layer 20L is not initially formed, the deposition of the unpatterned high dielectric constant (high-k) dielectric layer 30L and subsequent thermal processes lead to the formation of pre-existing interfacial layer (i.e., the unpatterned chemical oxide layer 20L) between the substrate semiconductor layer 10 and the unpatterned high dielectric constant (high-k) dielectric layer 30L. The unpatterned chemical oxide layer 20L may be formed by treatment of exposed semiconductor surfaces with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at 65° C. Alternately, the unpatterned chemical oxide layer 20L can also be formed by treating the HF-last semiconductor surface in ozonated aqueous solutions, with the ozone concentration usually varying from, but not limited to: 2 parts per million (ppm) to 40 ppm. The unpatterned chemical oxide layer 20L helps minimize mobility degradation in the substrate semiconductor layer 10 due to high-k dielectric material in the unpatterned high-k dielectric layer 30L. However, the thickness of the unpatterned chemical oxide layer 20L is thicker than necessary and increases the effective oxide thickness (EOT) of a composite dielectric stack, which includes the unpatterned chemical oxide layer 20L and the unpatterned high-k dielectric layer 30L. The scalability of EOT may be severely limited by the thickness of the unpatterned chemical oxide layer 20L. In case the substrate semiconductor layer is a silicon layer, the unpatterned chemical oxide layer 20L is a silicon oxide layer. Typically, the thickness of the unpatterned chemical oxide layer 20L is from 0.1 nm to 0.4 nm, although lesser and greater thicknesses are also contemplated herein.

An unpatterned high dielectric constant (high-k) dielectric layer 30L is formed on a top surface of the semiconductor substrate 8. The unpatterned high-k dielectric layer 30L comprises a high dielectric constant (high-k) material comprising a dielectric metal oxide and having a dielectric constant that is greater than the dielectric constant of silicon nitride of 7.5. The unpatterned high-k dielectric layer 30L may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide (of unpatterned high-k dielectric layer 30L) comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the unpatterned high-k dielectric layer 30L may be from 1 nanometer (nm) to 10 nm, and particularly from 1.5 nm to 3 nm. The unpatterned high-k dielectric layer 30L may have an effective oxide thickness (EOT) on the order of, or less than, 1 nm.

An unpatterned lower metal layer 40L is deposited directly on the top surface of the unpatterned high-k dielectric layer 30L. The unpatterned lower metal layer 40L may be formed, for example, by chemical vapor deposition (CVD), physical vapor deposition (PVD), or atomic layer deposition (ALD).

The material of the unpatterned lower metal layer 40L is herein referred to as a "first metallic compound" which may be a conductive transition metal nitride and/or a conductive transition metal carbide. The first metallic compound is a compound of a first metallic element selected from transition metals and a non-metallic element. If the non-metallic element is nitrogen, the first metallic compound is a transition metal nitride. If the non-metallic element is carbon, the first metallic compound is a transition metal carbide. For example, the first metallic compound may be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the unpatterned lower metal layer 40L may be from 1 nm to 10 nm, and particularly from 3 nm to 10 nm, although lesser and greater thicknesses are also contemplated herein.

An unpatterned scavenging metal layer 50L is deposited directly on the top surface of the unpatterned lower metal layer 40L. The unpatterned scavenging metal layer 50L may be formed, for example, by chemical vapor deposition (CVD), physical vapor deposition (PVD), or atomic layer deposition (ALD). Particularly, the exemplary semiconductor structure is transferred from a processing chamber that deposits the unpatterned lower metal layer 40L to another processing chamber that deposits the unpatterned scavenging metal layer 50L without breaking vacuum to prevent formation of any interfacial layer by oxidation or introduction of oxygen into the unpatterned lower metal layer 40L.

The material of the unpatterned scavenging metal layer 50L "scavenges" impurity oxygen from neighboring metallic layers during subsequent processing. For the unpatterned scavenging metal layer 50L to effectively scavenge impurity oxygen in subsequent processing steps, it is desired that introduction of oxygen into the unpatterned scavenging metal layer 50L is suppressed during the formation step. Further, the material for the unpatterned scavenging metal layer 50L is selected so that the material of the unpatterned scavenging metal layer 50L effectively scavenges impurity oxygen atoms from the unpatterned lower metal layer 40L and an unpatterned upper metal layer 60L to be subsequently formed. Additionally, the unpatterned scavenging metal layer 50L scavenges impurity oxygen atoms from two unpatterned oxide layers 60AL and 70AL (the combination of these two unpatterned oxide layers 60AL and 70AL may be referred to as a second oxide layer).

The unpatterned scavenging metal layer 50L may include a metal in an elemental form. Typical elemental metals that may be selected for the unpatterned scavenging metal layer 50L include, but are not limited to, Al, Be, Mg, Ca, Sr, Ba, Sc, Y, La, Ti, Zr, Hf, Dy, Lu, Er, Pr, and Ce. In one embodiment, the unpatterned scavenging metal layer 50L consists of at least one alkaline earth metal. In another embodiment, the unpatterned scavenging metal layer 50L consists of at least one transition metal. In yet another embodiment, the unpatterned scavenging metal layer 50L consists of a mixture of at least one alkaline earth metal and at least one transition metal. Particularly, the thickness of the unpatterned scavenging metal layer 50L may be from 0.1 nm to 3.0 nm, although lesser and greater thicknesses are also contemplated herein.

An unpatterned upper metal layer 60L is deposited directly on the top surface of the unpatterned scavenging metal layer 50L. The unpatterned upper metal layer 60L may be formed, for example, by chemical vapor deposition (CVD), physical vapor deposition (PVD), or atomic layer deposition (ALD). Particularly, the exemplary semiconductor structure is transferred from the processing chamber that deposits the unpatterned scavenging metal layer 50L to a processing chamber that deposits the unpatterned upper metal layer 60L without breaking vacuum to prevent formation of any interfacial layer by oxidation or introduction of oxygen into the unpatterned scavenging metal layer 50L.

The material of the unpatterned upper metal layer 60L is herein referred to as a "second metallic compound" which may be a conductive transition metal nitride or a conductive transition metal carbide. The second metallic compound is a compound of a second metallic element selected from transition metals and a non-metallic element. If the non-metallic element is nitrogen, the second metallic compound is a transition metal nitride. If the non-metallic element is carbon, the second metallic compound is a transition metal carbide. For example, the second metallic compound may be selected from TiN, TiC, TaN, TaC, and a combination thereof. The thickness of the unpatterned upper metal layer 60L may be from 1 nm to 100 nm, and particularly from 3 nm to 10 nm, although lesser and greater thicknesses are also contemplated herein.

In one case, the first metallic compound and the second metallic compound are the same material. In another case, the first metal compound and the second metal compound are different materials.

In one embodiment, the material for the unpatterned scavenging metal layer 50L is selected such that Gibbs free energy per oxygen atom for formation of an oxide for the unpatterned scavenging metal layer 50L is equal to or more negative than Gibbs free energy per oxygen atom for formation of an oxide of the first elemental metal within the first metallic compound for the unpatterned lower metal layer 40L. Further, the material for the unpatterned scavenging metal layer 50L is selected such that Gibbs free energy per oxygen atom for formation of an oxide for the unpatterned scavenging metal layer 50L is equal to or more negative than Gibbs free energy per oxygen atom for formation of an oxide of the second elemental metal within the second metallic compound for the unpatterned upper metal layer 60L.

For example, the first and second metallic compounds may be selected from TiN, TiC, TaN, TaC, and a combination thereof. The unpatterned scavenging metal layer 50L includes at least one of Al, Be, Mg, Ca, Sr, Ba, Sc, Y, La, Ti, Zr, Hf, Dy, Lu, Er, Pr, and Ce.

In one illustrative example according to this embodiment, each of the first metallic compound and the second metallic compound may be selected from TaN, TaC, and a combination thereof. Because titanium (Ti) has a more negative Gibbs free energy per oxygen atom for formation of an oxide than tantalum (Ta), the unpatterned scavenging metal layer 50L may comprise a metal in an elemental form and selected from Al, Be, Mg, Ca, Sr, Ba, Sc, Y, La, Ti, Zr, Hf, Dy, Lu, Er, Pr, and Ce in this illustrative example.

In another illustrative example according to this embodiment, at least one of the first metallic compound and the second metallic compound may be selected from TiN, TiC, and a combination thereof. The unpatterned scavenging metal layer 50L may include a metal in an elemental form and selected from Al, Be, Mg, Ca, Sr, Ba, Sc, Y, La, Zr, Hf, Dy, Lu, Er, Pr, and Ce in this illustrative example.

In a particular example, the first metallic compound of the unpatterned lower metal layer 40L and the second metallic compound of the unpatterned upper metal layer 60L are TiN and the unpatterned scavenging metal layer 50L is an aluminum layer including aluminum in elemental metal form.

Depositing the unpatterned upper metal layer 60L causes the unpatterned metal oxide layer 60AL to form on the unpatterned upper metal layer 60L. The unpatterned metal oxide layer 60AL is formed at the top portion of the unpatterned upper metal layer 60L. When the unpatterned upper metal layer 60L is titanium nitride, the unpatterned metal oxide layer 60AL is titanium oxide. The unpatterned metal oxide layer 60AL of titanium oxide is grown when the unpatterned upper metal layer 60L of titanium nitride is deposited.

Desirably, but not necessarily, an unpatterned polycrystalline semiconductor layer 70L is deposited directly on the top surface of the unpatterned upper metal layer 60L, for example, by low pressure chemical vapor deposition (LPCVD), rapid thermal chemical vapor deposition (RTCVD), or plasma enhanced chemical vapor deposition (PECVD). The unpatterned polycrystalline semiconductor layer 70L may comprise polysilicon, a polycrystalline silicon germanium alloy, a polycrystalline silicon carbon alloy, or a polycrystalline silicon germanium carbon alloy. The unpatterned polycrystalline semiconductor layer 70L may be formed as a doped polycrystalline semiconductor layer through in-situ doping. Alternately, the unpatterned polycrystalline semiconductor layer 70L may be doped by ion implantation of dopant atoms after deposition of the unpatterned polycrystalline semiconductor layer 70L and prior to patterning of a gate electrode. Yet alternately, implantation of dopant ions may be performed on a remaining portion of the unpatterned polycrystalline semiconductor layer 70L after patterning of the gate electrode. The thickness of the unpatterned polycrystalline semiconductor layer 70L may be from 10 nm to 300 nm, and typically from 50 nm to 100 nm, although lesser and greater thicknesses are also contemplated herein. Embodiments in which the unpatterned polycrystalline semiconductor layer 70L is not formed and the stack of the unpatterned lower metal layer 40L, unpatterned scavenging metal layer 50L, and unpatterned upper metal layer 60L constitutes a gate electrode layer.

Depositing the unpatterned upper metal layer 60L causes the unpatterned oxide layer 70AL to form at the bottom portion of the unpatterned polycrystalline semiconductor layer 70L. When the unpatterned polycrystalline semiconductor layer 70L is silicon, the unpatterned oxide layer 70AL is silicon dioxide. The unpatterned oxide layer 70AL of silicon dioxide is grown when the unpatterned polycrystalline semiconductor layer 70L of silicon is deposited.

A photoresist layer (not shown) is applied to the top surface of the unpatterned polycrystalline semiconductor layer 70L and lithographically patterned to form a photoresist portion 77 (See FIG. 2), which has the shape of a gate electrode to be subsequently formed. The pattern in the photoresist portion 77 is transferred into the stack of the unpatterned polycrystalline semiconductor layer 70L, the unpatterned oxide layer 70AL, the unpatterned metal oxide layer 60AL, the unpatterned upper metal layer 60L, the unpatterned scavenging metal layer 50L, the unpatterned lower metal layer 40L, the unpatterned high-k dielectric layer 30L, and the unpatterned chemical oxide layer 20L. The pattern transfer may be effected by an anisotropic etch that employs the photoresist portion 77 as an etch mask.

Figure 2:
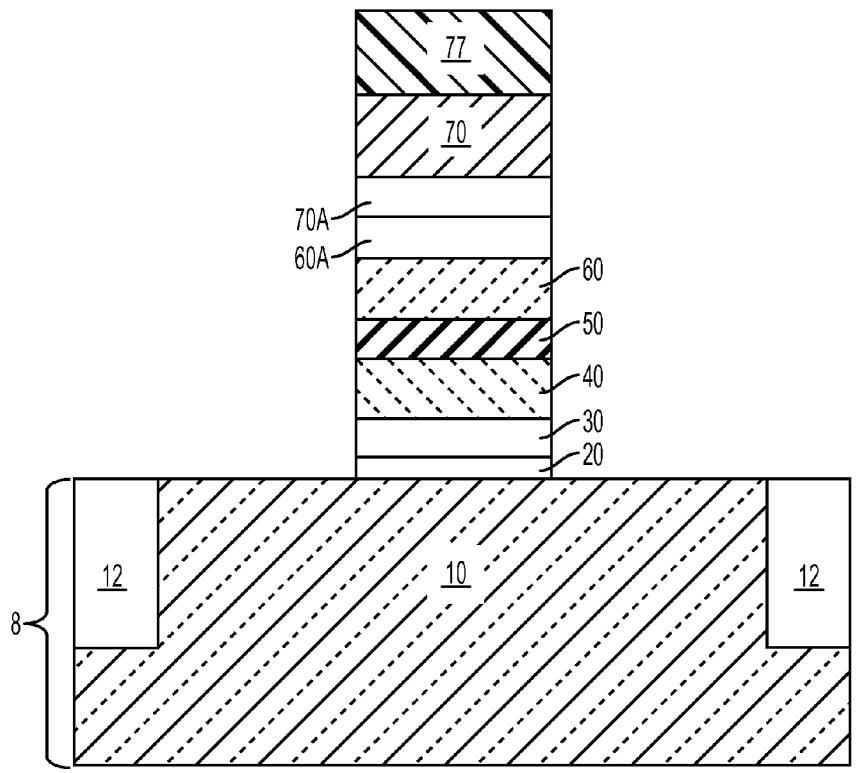
FIG. 2 is a vertical cross-sectional view of the exemplary semiconductor structure after patterning of a gate dielectric and a gate electrode according to an embodiment.

Referring to FIG. 2, the remaining portions of the unpatterned polycrystalline semiconductor layer 70L, the unpatterned oxide layer 70AL, the unpatterned metal oxide layer 60AL, the unpatterned upper metal layer 60L, the unpatterned scavenging metal layer 50L, the unpatterned lower metal layer 40L constitute a gate electrode. As a result of these remaining portions after pattern transfer, the gate electrode includes the polycrystalline semiconductor layer 70, the oxide layer 70A, the metal oxide layer 60A, the upper metal layer 60, the scavenging metal layer 50, and the lower metal layer 40. The gate electrode (40, 50, 60, 60A, 70A, 70) is typically patterned as a line having a width, which is the width of the lower metal layer 40 as shown in FIG. 2 and is referred to as a "gate length." The gate length depends on the device characteristics and may be from the lithographically printable smallest dimension to 10 microns. Typically, the gate length is from 32 nm to 1 micron (μm), although lesser and greater gate lengths are also contemplated herein.

The remaining portion of the unpatterned high-k dielectric layer 30L is herein referred to as a high-k dielectric layer 30, and the remaining portion of the unpatterned chemical oxide layer 20L is herein referred to as a chemical oxide layer 20. The high-k dielectric layer 30 and the chemical oxide layer 20 collectively constitute a gate dielectric (20, 30). Typically, the gate dielectric (20, 30) has an effective oxide thickness (EOT) less than 1.2 nm, and may have an EOT less than 1.0 nm. The photoresist portion 77 is subsequently removed, for example, by ashing.

The sidewalls of the gate electrode (40, 50, 60, 60A, 70A, 70) and the gate dielectric (20, 30) are typically substantially vertical, i.e., parallel to the surface normal of the exposed surface of the substrate semiconductor layer 10. Further, the sidewalls of the gate electrode (40, 50, 60, 60A, 70A, 70) and the gate dielectric (20, 30) are typically substantially vertically coincident with each other.

Figure 3:
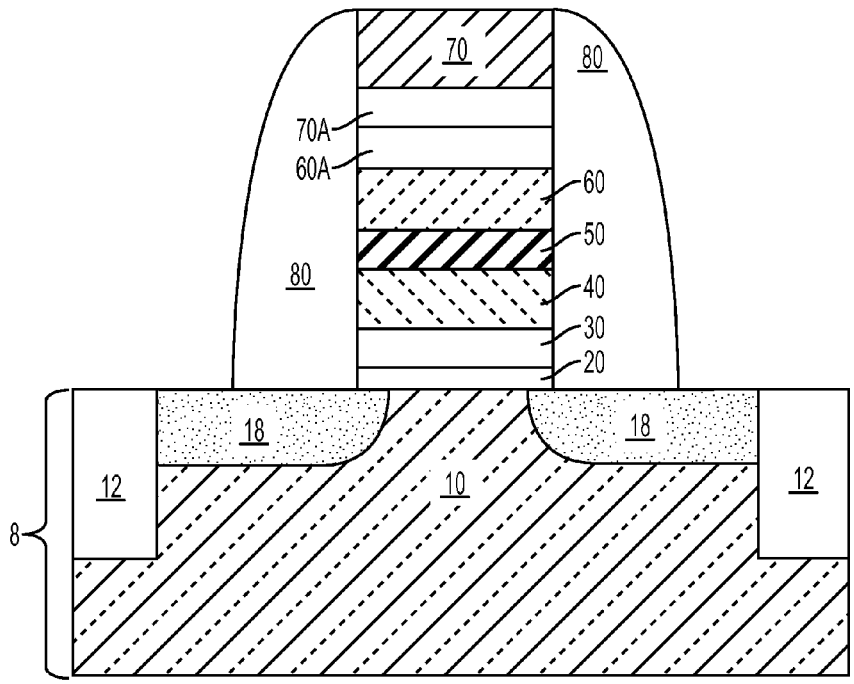
FIG. 3 is a vertical cross-sectional view of the exemplary semiconductor structure after formation of a gate spacer and source and drain extension regions according to an embodiment.

Referring to FIG. 3, source and drain extension regions 18 are formed by ion implantation that employs the gate electrode (40, 50, 60, 60A, 70A, 70) and the gate dielectric (20, 30) as an implantation mask. The source and drain extension regions 18 have a doping of the opposite conductivity type of the doping of the substrate semiconductor layer 10. For example, if the substrate semiconductor layer 10 has a p-type doping, the source and drain extension regions 18 have an n-type doping, and vice versa. The dopant concentration of the source and drain extension regions 18 may be from $1.0 \times 10^{19}/cm^3$ to $1.0 \times 10^{21}/cm^3$, although lesser and greater dopant concentrations are contemplated herein also. Each of the source and drain extension regions 18 abut peripheral portions of the gate dielectric (20, 30).

Optionally, a halo implantation may be performed at this step to introduce dopants of the same conductivity type as the doping of the substrate semiconductor layer 10 to volumes of the substrate semiconductor layer 10 located underneath peripheral portions of the gate electrode (40, 50, 60, 60A, 70A, 70) and the gate dielectric (20, 30).

A gate spacer 80 laterally abutting the sidewalls of the gate electrode (40, 50, 60, 60A, 70A, 70) and the sidewalls of the gate dielectric (20, 30) is formed, for example, by deposition of a conformal dielectric material layer followed by an anisotropic ion etching. The portion of the dielectric material layer that is formed directly on the sidewalls of the gate electrode (40, 50, 60, 60A, 70A, 70) and the gate dielectric (20, 30) remain after the anisotropic etch to constitute a gate spacer 80 that laterally surrounds the gate electrode (40, 50, 60, 60A, 70A, 70) and the gate dielectric (20, 30). Particularly, the gate spacer 80 includes an oxygen-impermeable material such as silicon nitride.

Figure 4A:
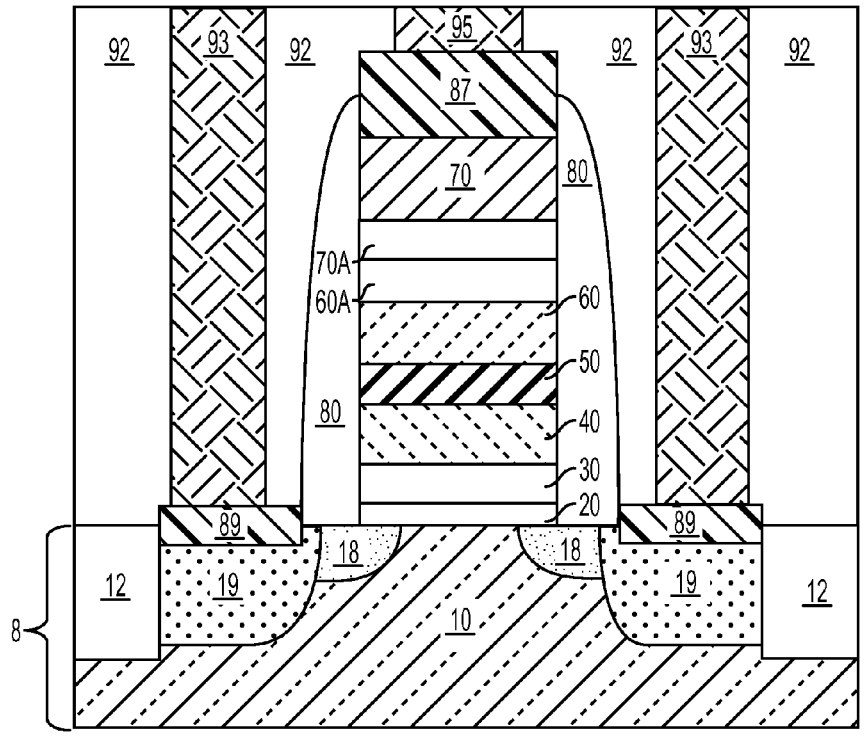
FIG. 4A is a vertical cross-sectional view of the exemplary semiconductor structure after formation of silicide regions, a dielectric material layer, and contact vias according to an embodiment.
Figure 4B:
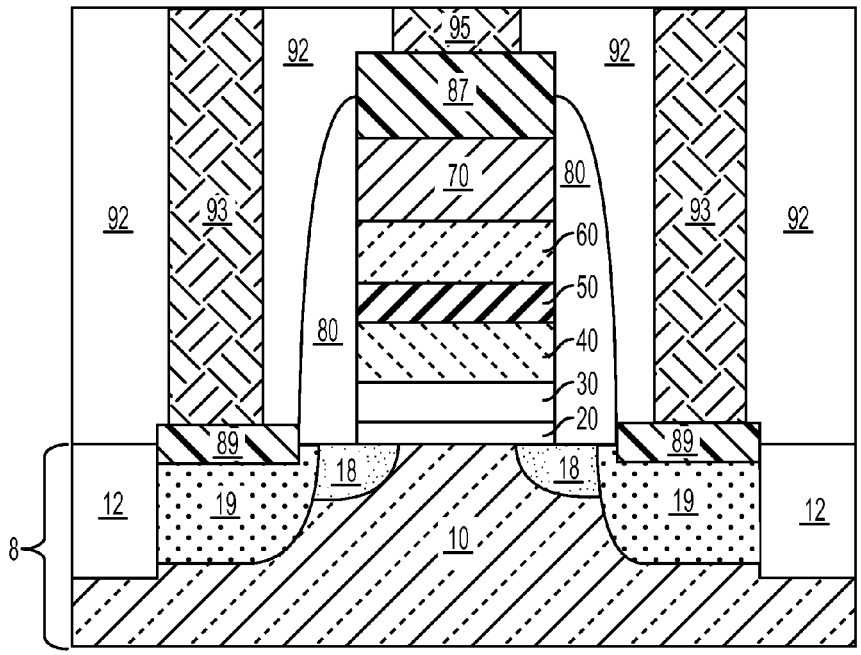
FIG. 4B is a vertical cross-sectional view of the exemplary semiconductor structure after oxide layers are removed/reduced according to an embodiment.

Referring to FIGS. 4A and 4B (which may be generally referred to as FIG. 4), source and drain regions 19 are formed by ion implantation that employs the gate electrode (40, 50, 60, 60A, 70A, 70) and the gate spacer 80 as an implantation mask. The source and drain regions 19 have a doping of the same conductivity type as the doping of the source and drain extension regions 18. The dopant concentration of the source and drain regions 19 may be from $1.0 \times 10^{19}/cm^3$ to $1.0 \times 10^{21}/cm^3$, although lesser and greater dopant concentrations are contemplated herein also.

An activation anneal is thereafter performed to activate electrical dopants implanted within the source and drain extension regions 18 and the source and drain regions 19. Such an activation anneal is typically performed at an elevated temperature, which facilitates regrowth of the chemical oxide layer 20 in prior art semiconductor structures. In the present disclosure, however, the chemical oxide layer 20 thickness is maintained or reduced in the exemplary semiconductor structure in FIGS. 4A and 4B because the scavenging metal layer 50 consumes (removes) oxygen from the chemical oxide layer 20 and prevents the down-diffusion of oxygen atoms incorporated as impurities in the semiconductor structure. Therefore, the equivalent oxide thickness (EOT) of the gate dielectric (20, 30) is maintained or reduced to a sufficiently small value during the activation anneal or in any other thermal processing step in an oxidizing ambient.

Figure 7:
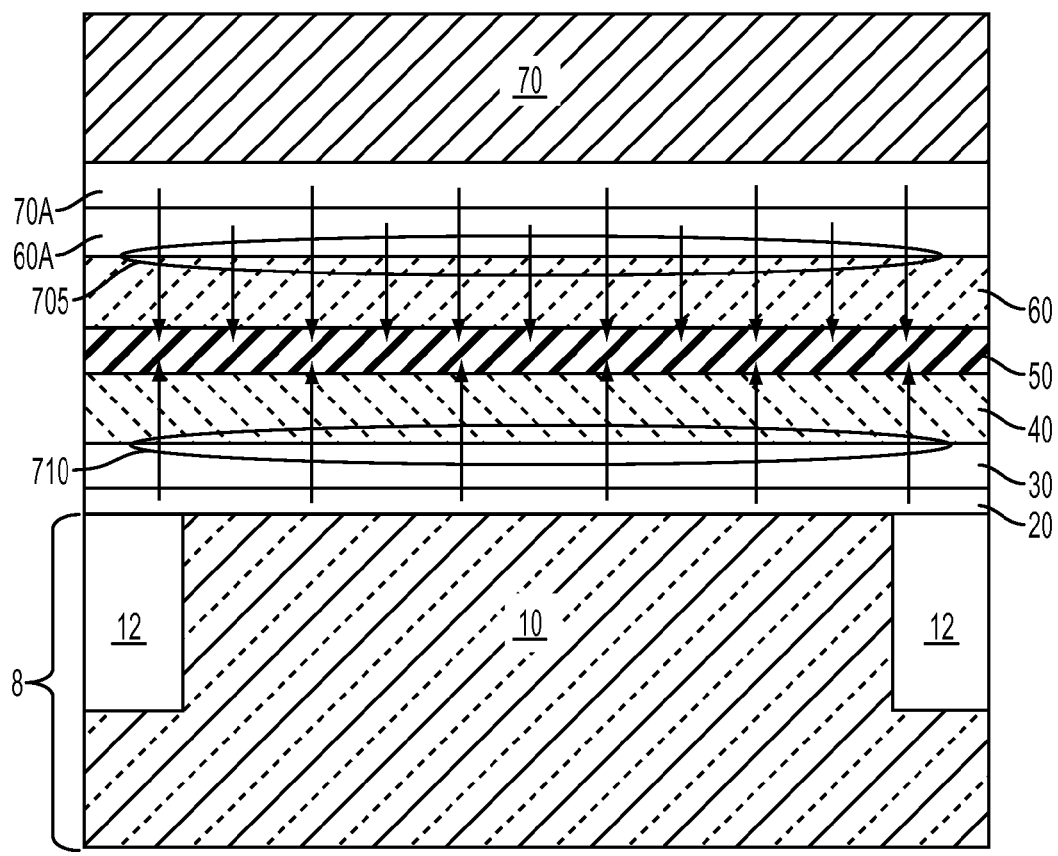
FIG. 7 is a vertical cross-sectional view of the exemplary semiconductor structure removing oxygen atoms during anneal according to an embodiment.

Additionally, the activation anneal causes the scavenging metal layer 50 to remove (i.e., consume) oxygen from metal oxide layer 60A and the oxide layer 70A as shown in FIG. 7. FIG. 7 illustrates a cross-sectional view of the exemplary semiconductor structure removing oxygen atoms during anneal.

As noted above, both oxide layers 60A and 70A are unintentionally formed, and the scavenging metal layer 50 is designed/configured to remove oxygen atoms and oxygen molecules from the oxide layers 60A and 70A during anneal (i.e., elevated temperatures as discussed herein). As shown by arrows 705, the oxygen atoms/molecules are being respectively removed from the both oxide layers 60A and 70A and attracted to the scavenging metal layer 50 during anneal. Subsequently, the scavenging metal layer 50 is oxidized by the attracted oxygen from both oxide layers 60A and 70A. Referring back to FIG. 4B, after annealing, the oxide layers 60A and 70A are now reduced and/or removed (in thickness). Additionally, as discussed herein, the scavenging metal layer 50 also (simultaneously) removes the impurity oxygen atoms from the chemical oxide layer 20 (shown by arrows 710) while respectively removing impurity oxygen atoms from the oxide layers 60A and 70A. In one case, FIG. 4A can represent the oxide layers 60A and 70A as being partially present (e.g., one or both of the oxide layers 60A and 70A may still partially be present) after annealing although some or most of their respective oxygen atoms have been removed.

In FIGS. 4A and 4B, a metal layer (not shown) is formed over the entire exposed top surfaces of the exemplary semiconductor structure and reacted with exposed semiconductor materials to form various metal semiconductor alloy regions. The metal layer comprises a metal that reacts with the semiconductor material in the source and drain regions 19 and the polycrystalline semiconductor layer 70. Non-limiting exemplary materials for the metal layer include nickel, platinum, palladium, cobalt or a combination thereof. The formation of the metal layer may be effected by physical vapor deposition (PVD), chemical vapor deposition (CVD), or atomic layer deposition (ALD). The metal layer may be deposited in a conformal or non-conformal manner. Particularly, the metal deposition is substantially conformal.

The exposed semiconductor surfaces in direct contact with the metal layer are metallized by reacting with the metal in the metal layer during a metallization anneal. The metallization is effected by an anneal at a temperature from 350° C. to 550° C., which is typically performed in an inert gas atmosphere, e.g., He, Ar, $N_2$, or forming gas. Particularly, the anneal is performed at a temperature from 400° C. to 500° C. A continuous heating at a constant temperature or various ramping in temperature may be employed. The metallization may further be effected by an additional anneal at a temperature from 400° C. to 750° C., and particularly from 500° C. to 700° C. After the metallization process, unreacted portions of the metal layer, which are present over dielectric surfaces such as the gate spacer 80 and the shallow trench isolation structures 12, are removed selective to various metal semiconductor alloy portions by an etch, which may be a wet etch. A typical etchant for such a wet etch employs aqua regia.

The metallization forms source and drain metal semiconductor alloy regions 89 directly on each of the source and drain regions 19. Further, a gate metal semiconductor alloy region 87 is formed directly on the top surface of the polycrystalline semiconductor layer 70.

A dielectric material layer 92 is deposited over the entirety of the top surfaces of the exemplary semiconductor structure. The dielectric material layer 92 comprises a dielectric material such as silicon oxide, silicon nitride, silicon oxynitride, or a combination thereof.

Particularly, the dielectric material layer 92 includes a mobile ion barrier layer (not shown). The mobile ion barrier layer typically comprises an impervious dielectric material such as silicon nitride and directly contacts the various metal semiconductor alloy regions (89, 87). The dielectric material layer 92 may additionally include, for example, a spin-on-glass and/or chemical vapor deposition (CVD) oxide such as undoped silicate glass (USG), borosilicate glass (BSG), phosphosilicate glass (PSG), fluorosilicate glass (FSG), borophosphosilicate glass (BPSG), or a combination thereof. Alternately, the dielectric material layer 92 may comprise a low-k dielectric material having a dielectric constant less than 3.9 (the dielectric constant of silicon oxide), and particularly less than 2.5. Exemplary low-k dielectric materials include organosilicate glass (OSG) and SiLK™.

The dielectric material layer 92 is subsequently planarized to form a substantially planar top surface. Source and drain contact vias 93 and a gate contact via 95 are formed through the dielectric material layer 92 to provide electrical contact to the source and drain regions 19, respectively, and to the gate electrode (40, 50, 60, 60A, 70A, 70).

The exemplary semiconductor structure in FIGS. 4A and 4B functions as a field effect transistor having a high-k gate dielectric and a metal gate. The presence of the scavenging metal layer 50 within the gate electrode (40, 50, 60, 60A, 70A, 70) prevents oxygen atoms that diffuse down the polycrystalline semiconductor layer 70 from passing into the lower metal layer 40 because the oxygen atoms are scavenged by the scavenging metal layer 50. Therefore, the field effect transistor of the present disclosure provides a superior reliability against oxygen diffusion that may degrade or alter the device parameters of the field effect transistor.

By removing and/or reducing the oxide layers 60A and 70A (along with the chemical oxide layer 20), the vertical resistance of the gate electrode (40, 50, 60, 60A, 70A, 70) is decreased, thus improving the AC performance of the field effect transistor in FIGS. 4A and 4B. The vertical resistance of the gate is increased by the presence of oxide layers 60A and 70A since they create a high resistance path between the interfaces. An increase in the vertical gate resistance will degrade the ring oscillator delay of a CMOS (complementary metal oxide semiconductor) device and thereby it is critical (but not a necessity) to eliminate these layers (oxide layers 60A and 70A). In a CMOS device for a given ring oscillator design with ideal resistances, there is an expected ratio of the AC resistance to DC resistance. Any increase in the AC resistance at a given DC resistance is indicative of such interfacial resistance paths. Elimination of the oxides will help drive the ratios to ideality (e.g., ideal values). This (AC resistance to DC resistance) ratio is typically 0.900-0.950 for the conventional gate stack. In the present disclosure, the ratio is reduced to 0.850-0.875, resulting in improved ring oscillator delay of a CMOS device.

Figure 5:
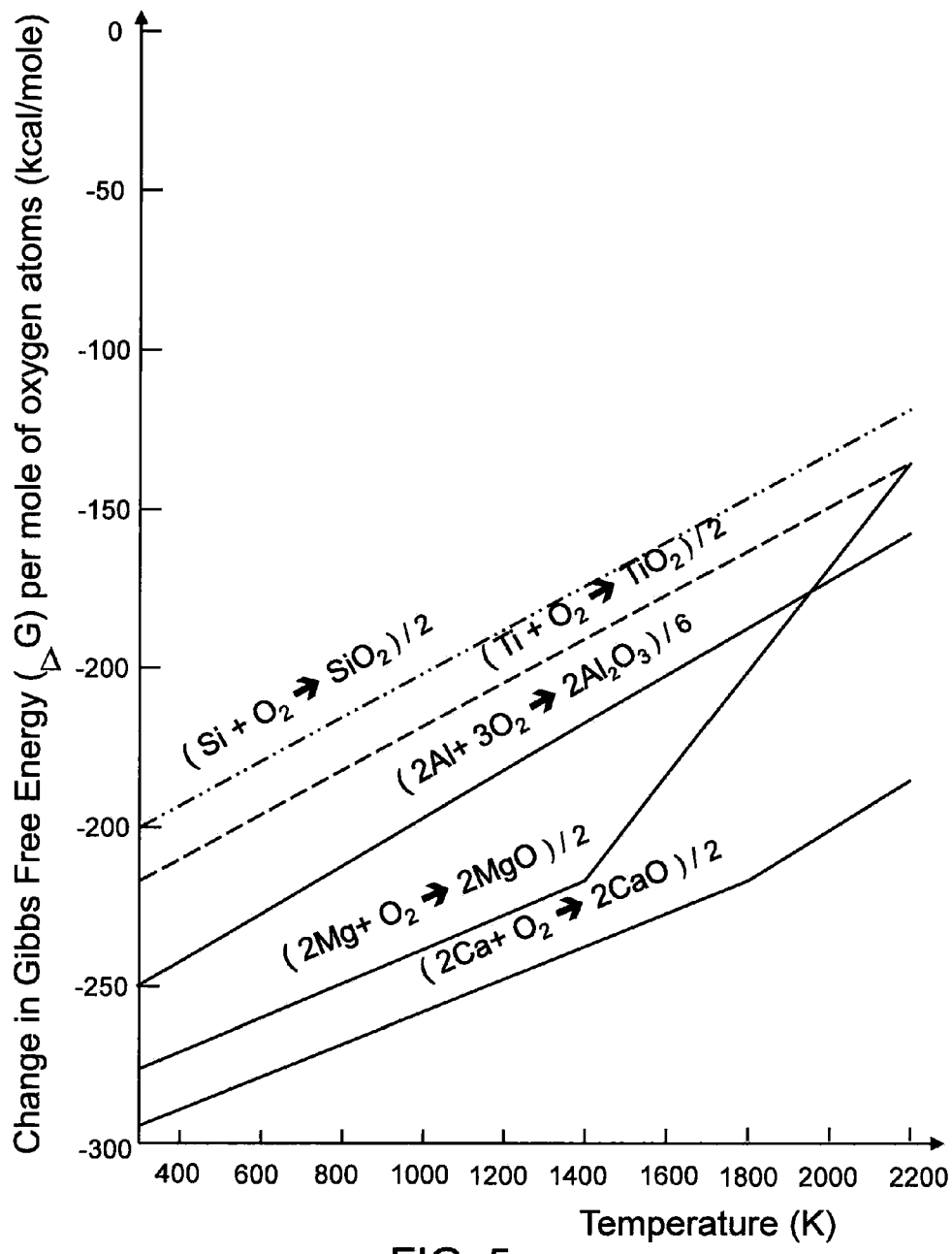
FIG. 5 is a graph showing the amount of change in Gibbs free energy during oxidation of various metals.

Referring to FIG. 5, the amount of change in Gibbs free energy per oxygen atom during oxidation of various metals is shown within a temperature range from 300 K to 2,200 K. When a reaction having a more negative change in Gibbs free energy per oxygen atom competes with another reaction having a less negative change in Gibbs free energy per oxygen atom for a limited supply of reactants, the reaction with the more negative change in Gibbs free energy dominates the reaction and consumes a prevailing majority of the available reactants. In the case of oxidation reactions within the gate electrode (40, 50, 60, 60A, 70A, 70; See FIG. 4) during a high temperature anneal in an oxidizing ambient, oxygen atoms or oxygen molecules that diffuse through the polycrystalline semiconductor layer 70 (See FIG. 4) and the upper metal layer 60 (See FIG. 4) are the reactants that are supplied in a limited quantity. Within the temperature range of the activation anneal, which is typically performed at about 1,000° C., or about 1,300 K, elemental metals such as Al, Be, Mg, Ca, Sr, Ba, Sc, Y, La, Zr, Hf, Dy, Lu, Er, Pr, and Ce have more negative changes in Gibbs free energy relative to typical transition metals such as Ti and Ta. Therefore, elemental metals such as Al, Be, Mg, Ca, Sr, Ba, Sc, Y, La, Zr, Hf, Dy, Lu, Er, Pr, and Ce effectively function as the scavenging material for the scavenging metal layer 50 (See FIG. 4).

The Gibbs free energy changes for some selected elemental metal atoms by reaction $Si + 2/y\ M_xO_y \rightarrow 2x/y\ M + SiO_2$ are given in Table 1.

TABLE 1

The Gibbs free energy change at 1000 K for the reaction $Si + 2/y\ M_xO_y \rightarrow 2x/y\ M + SiO_2$, wherein M is the elemental metal.

| Oxide | $Li_2O$ | $Na_2O$ | $K_2O$ | BeO | MgO | CaO | SrO | BaO |
|---|---|---|---|---|---|---|---|---|
| ΔG | +24.298 | −20.061 | −33.749 | +32.405 | +30.572 | +39.914 | +30.821 | +21.338 |
| Oxide | $Sc_2O_3$ | $Y_2O_3$ | $La_2O_3$ | $Ce_2O_3$ | $CeO_2$ | $Pr_2O_3$ | $PrO_2$ | $Nd_2O_3$ |
| ΔG | +123.11 | +116.82 | +98.470 | +104.95 | +36.209 | +105.76 | +13.559 | +101.69 |
| Oxide | $Sm_2O_3$ | EuO | $Eu_2O_3$ | $Gd_2O_3$ | $Tb_2O_3$ | $TbO_{1.72}$ | $Dy_2O_3$ | $Ho_2O_3$ |
| ΔG | +103.94 | +33.238 | +61.901 | +101.55 | +114.76 | +38.273 | +112.44 | +118.45 |
| Oxide | $Er_2O_3$ | $Tm_2O_3$ | $Yb_2O_3$ | $Lu_2O_3$ | $ThO_2$ | $UO_2$ | TiO | $Ti_2O_3$ |

TABLE 1-continued

The Gibbs free energy change at 1000 K for the reaction Si + 2/y $M_xO_y \rightarrow 2x/y\ M + SiO_2$, wherein M is the elemental metal.

| ΔG | +112.03 | +116.65 | +103.83 | +116.97 | +75.513 | +43.670 | +17.749 | +35.432 |
|---|---|---|---|---|---|---|---|---|
| Oxide | $TiO_2$ | $ZrO_2$ | $HfO_2$ | VO | $V_2O_3$ | $VO_2$ | NbO | $NbO_2$ |
| ΔG | +7.527 | +42.326 | +47.648 | −5.314 | −30.197 | −43.280 | −10.132 | −13.872 |
| Oxide | $Nb_2O_5$ | $Ta_2O_5$ | $Cr_2O_3$ | $MoO_2$ | $MoO_3$ | $WO_2$ | $WO_{2.72}$ | $WO_3$ |
| ΔG | −86.228 | −52.533 | −55.275 | −76.902 | −143.78 | −77.126 | −107.20 | −121.81 |
| Oxide | MnO | $Mn_3O_4$ | $Mn_2O_3$ | $TcO_2$ | $ReO_2$ | FeO | $Fe_3O_4$ | $Fe_2O_3$ |
| ΔG | −12.752 | −100.60 | −94.689 | −112.91 | −126.66 | −37.774 | −160.08 | −127.47 |
| Oxide | $RuO_2$ | $OsO_2$ | CoO | $Rh_2O_3$ | $IrO_2$ | NiO | PdO | $Cu_2O$ |
| ΔG | −142.27 | −147.25 | −48.041 | −235.15 | −159.47 | −51.377 | −86.066 | −64.284 |
| Oxide | CuO | ZnO | CdO | $Al_2O_3$ | $Ga_2O_3$ | $In_2O_3$ | $GeO_2$ | SnO |
| ΔG | −71.375 | −28.461 | −49.433 | +63.399 | −79.411 | −117.72 | −82.124 | −43.514 |
| Oxide | $SnO_2$ | PbO | $Pb_3O_4$ | $PbO_2$ | $SbO_2$ | $Bi_2O_3$ | $TeO_2$ | |
| ΔG | −84.977 | −59.249 | −269.62 | −155.79 | −110.52 | −191.85 | −140.95 | |

Figure 6:
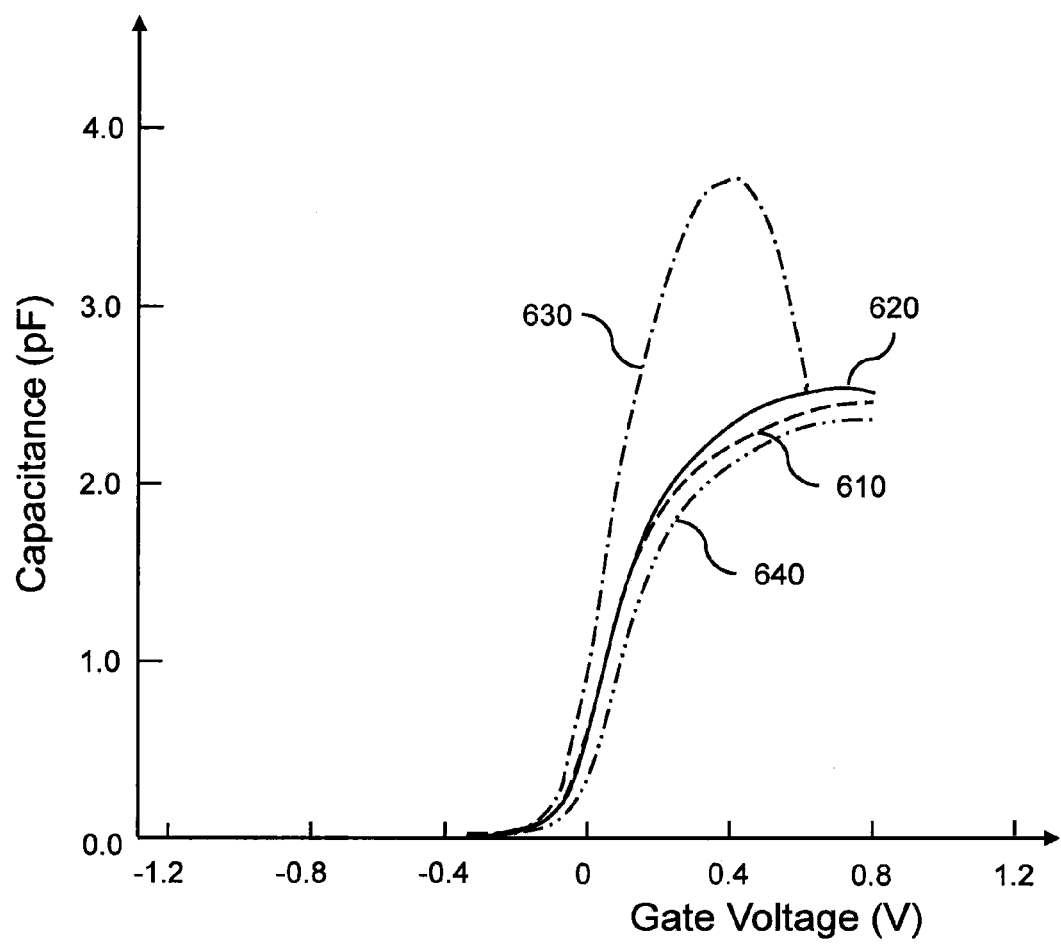
FIG. 6 is a graph showing capacitance as a function of the gate voltage for four types of metal gate electrodes.

Referring to FIG. 6, test data for capacitance as a function of the gate voltage is shown for three types of metal gate electrodes. A first curve 610 shows the capacitance for a reference gate electrode including an 8 nm thick TiN layer and a polycrystalline semiconductor layer formed directly thereupon according to the prior art. A second curve 620 shows the capacitance for an exemplary gate electrode according to the present disclosure that includes a stack, from bottom to top, of a 3.5 nm thick TiN layer as a lower metal layer, a 1.0 nm Ti layer as a scavenging metal layer, a 3.5 nm thick TiN layer an upper metal layer, and a polycrystalline semiconductor layer. A third curve 630 shows the capacitance for another exemplary gate electrode according to the present disclosure that includes a stack, from bottom to top, of a 3.5 nm thick TiN layer as a lower metal layer, a 1.0 nm Al layer as a scavenging metal layer, a 3.5 nm thick TiN layer an upper metal layer, and a polycrystalline semiconductor layer. A fourth curve 640 shows the capacitance for an counterexample gate electrode that was formed against the teaching of the instant disclosure by includes a stack, from bottom to top, of a 3.5 nm thick TiN layer as a lower metal layer, a 1.0 nm Ta layer as a scavenging metal layer, a 3.5 nm thick TiN layer an upper metal layer, and a polycrystalline semiconductor layer. Ta has less decrease in Gibbs free energy than Ti so that use of Ta as a scavenging material layer should be avoided if the lower metal layer and the upper metal layer include TiN according to the present disclosure. Thus, the structure of the counterexample gate electrode is not desirable. A $HfO_2$ layer was employed as a high-k dielectric layer, which was formed between a substrate semiconductor layer and each gate electrode. All four gate electrode structures were subjected to an activation anneal at a temperature about 1,000° C. in an oxidizing ambient.

Comparison of the four curves (610, 620, 630) shows that the effective capacitance achieved by the gate stacks of the present disclosure, as demonstrated by the second and third curves (620, 630), is greater than the capacitance achieved by the reference gate stack, as demonstrated by the first curve 610. Thus, the effective oxide thickness (EOT) achieved by the gate stacks of the present disclosure is less than the EOT achieved by the reference gate stack, providing enhanced performance. In other words, use of the gate electrode of the present disclosure, which includes a lower metal layer, a scavenging layer, and an upper metal layer, resulted in reduction of EOT compared with a prior art reference structure that employs a single metal layer instead.

In contrast, the effective capacitance achieved by the counterexample gate stacks, as demonstrated by the fourth curve 640, is less than the capacitance achieved by the prior art gate stack, as demonstrated by the first curve 610. Thus, the effective oxide thickness (EOT) achieved by the counterexample gate stack is greater than the EOT achieved by the prior art gate stack, providing worse performance. In other words, use of the wrong type of material that is taught away from in the present disclosure for a scavenging layer resulted in increase of EOT compared with the prior art reference structure that employs a single metal layer instead. Thus, the importance of the selection of the material for the scavenging metal layer is underscored by the counterexample.

The scavenging metal layer 50 captures oxygen atoms from above and from below, i.e., the scavenging metal layer 50 captures oxygen atoms as the oxygen atoms diffuse through the polycrystalline semiconductor layer 70, the oxide layer 70A, the metal oxide layer 60A, and the upper metal layer 60 in the gate electrode toward the high-k gate dielectric 30. Because the scavenging metal layer is more prone to oxide formation than the lower metal layer 40 and the upper metal layer 60, the oxygen atoms are consumed within the scavenging metal layer 50 and the oxygen atoms do not reach the high-k gate dielectric 30. In addition, the scavenging metal layer 50 actively reduces the thickness of the chemical oxide layer 20 underneath the high-k dielectric 30 as additional oxygen atoms migrate toward the chemical oxide layer 20 from below or from the side of the chemical oxide layer 20. Likewise, the scavenging metal layer 50 actively reduces the thickness of the metal oxide layer 60A and the oxide layer 70A as oxygen atoms attempt to migrate toward the oxide layers 60A and 70A. Such migrating oxygen atoms are captured by the scavenging metal layer 50 instead of being incorporated into the chemical oxide layer 20, metal oxide layer 60A, and/or oxide layer 70A. Not only is growth of the chemical oxide layer 20 underneath the high-k gate dielectric 30, growth of the metal oxide layer 60A above the upper metal layer 60, and growth of the oxide layer 70A beneath the polycrystalline semiconductor layer 70 prevented, but the thickness of the chemical oxide layer 20, metal oxide layer 60A, and/or oxide layer 70A is reduced/removed as a significant portion of the oxygen atoms in the chemical oxide layer 20, metal oxide layer 60A, and/or oxide layer 70A is consumed by the scavenging metal layer 50. Thus, the field effect transistor maintains a constant threshold voltage even after a high temperature anneal in oxygen ambient. By reducing and limiting the thickness of the thickness of the chemical oxide layer 20, metal oxide layer 60A, and/or oxide layer 70A than what is normally obtainable by conventional processing, the effective oxide thickness (EOT) of a composite gate dielectric stack, which includes the chemical oxide layer 20 and the high-k dielectric 30, is reduced, thereby enhancing the scalability of the composite gate dielectric stack and performance of the field effect transistor.

FIG. 8 illustrates a method 800 of forming a semiconductor structure with the scavenging metal layer 50 to remove and/or reduce the oxidized layers 60A and 70A, along with chemical oxide layer 20 according to an embodiment.

The gate dielectric is formed on the semiconductor substrate 8 of a semiconductor material at block 805. The gate dielectric (20, 30) includes a high dielectric constant (high-k) dielectric layer having a dielectric constant greater than silicon and is located on the semiconductor substrate 8.

At block 810, the gate electrode (40, 50, 60, 60A, 70A, 70) abuts the gate dielectric (20, 30), and the gate electrode includes the lower metal layer 40 abutting the gate dielectric, the scavenging metal layer 50 abutting the lower metal layer 40, the upper metal layer 60 abutting the scavenging metal layer 50, and the silicon layer 70 abutting the upper metal layer 60.

The scavenging metal layer reduces and/or removes an oxidized layer (e.g., the metal oxidized layer 60A, the oxidized layer 70A, or both) at an interface between the upper metal layer 60 and the silicon layer (e.g., the polycrystalline semiconductor layer 70) responsive to annealing at block 815.

The lower metal layer 40 comprises at least one of a conductive transition metal nitride and a conductive transition metal carbide. Also, the upper metal layer 60 comprises at least one of a conductive transition metal nitride and a conductive transition metal carbide.

An interface between the semiconductor substrate 8 and the gate dielectric (20, 30) comprises another oxidized layer (e.g., the chemical oxidized layer 20), and the other oxidized layer (e.g., the chemical oxidized layer 20) comprises at least one of silicon atoms and metal atoms. Accordingly, the scavenging metal layer 50 scavenges oxygen atoms from the other oxidized layer (e.g., the chemical oxidized layer 20).

The scavenging metal layer 50 increases a vertical resistance of the gate electrode (40, 50, 60, 60A, 70A, 70) by reducing/removing the oxidized layer (e.g., the combination of the metal oxidized layer 60A and oxidized layer 70A) at the interface between the upper metal layer 60 and the silicon layer (e.g., the polycrystalline semiconductor layer 70) responsive to annealing.

The scavenging metal layer 50 attracts oxygen atoms from the interface between the upper metal layer 60 and the silicon layer (polycrystalline semiconductor layer 70) responsive to annealing, and the oxidized layer at the interface between the upper metal layer 60 and the silicon layer (polycrystalline semiconductor layer 70) comprises metal oxide layer 60A and a silicon dioxide layer (e.g., the oxidized layer 70A). The scavenging metal layer attracts oxygen atoms from both the metal oxide layer and the silicon dioxide layer (if both are present and/or either one that is present). The metal oxide layer 60A is at least one of titanium oxide and tantalum oxide. The scavenging metal layer 50 includes a metal in an elemental for and selected from Al, Be, Mg, Ca, Sr, Ba, Sc, Y, La, Zr, Hf, Dy, Lu, Er, Pr, and Ce.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a semiconductor structure, comprising:
   forming a gate dielectric on a semiconductor substrate of a semiconductor material, the gate dielectric comprising a high dielectric constant dielectric layer having a dielectric constant greater than silicon and located on the semiconductor substrate; and
   forming a gate electrode abutting the gate dielectric, the gate electrode including a lower metal layer abutting the gate dielectric, a scavenging metal layer abutting the lower metal layer, an upper metal layer abutting the scavenging metal layer, and a silicon layer abutting the upper metal layer;
   the scavenging metal layer reducing an oxidized layer at an interface between the upper metal layer and the silicon layer in response to elevated temperature annealing;
   wherein the oxidized layer at the interface between the upper metal layer and the silicon layer comprises a metal oxide layer and a silicon dioxide layer; and
   wherein the scavenging metal layer attracts oxygen atoms from both the metal oxide layer and the silicon dioxide layer.

2. The method of claim 1, wherein the upper metal layer and the lower metal layer comprise titanium nitride.

3. The method of claim 1, wherein an interface between the semiconductor substrate and the gate dielectric comprises another oxidized layer;
   wherein the other oxidized layer comprises at least one of silicon atoms and metal atoms; and
   wherein the scavenging metal layer scavenges oxygen atoms from the other oxidized layer.

4. The method of claim 1, wherein the scavenging metal layer reduces vertical resistance of the gate electrode by reducing the oxidized layer at the interface between the upper metal layer and the silicon layer in response to annealing.

5. The method of claim 1, wherein the scavenging metal layer attracts oxygen atoms from the interface between the upper metal layer and the silicon layer responsive to annealing.

6. The method of claim 1, wherein the metal oxide layer is at least one of titanium oxide and tantalum oxide.

7. The method of claim 1, wherein the scavenging metal layer includes a metal in an elemental form and selected from the group consisting of Al, Be, Mg, Ca, Sr, Ba, Sc, Y, La, Zr, Hf, Dy, Lu, Er, Pr, and Ce.

* * * * *